(12) United States Patent
Manipatruni et al.

(10) Patent No.: US 10,416,217 B2
(45) Date of Patent: Sep. 17, 2019

(54) ON-CHIP TEST CIRCUIT FOR MAGNETIC RANDOM ACCESS MEMORY (MRAM)

(71) Applicant: Intel Corporation, Santa Clara, CA (US)

(72) Inventors: Sasikanth Manipatruni, Hillsboro, OR (US); Chia-Ching Lin, West Lafayette, IN (US); Yih Wang, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 936 days.

(21) Appl. No.: 14/749,324

(22) Filed: Jun. 24, 2015

(65) Prior Publication Data

US 2016/0377669 A1 Dec. 29, 2016

(51) Int. Cl.
| | |
|---|---|
| *G01R 31/12* | (2006.01) |
| *G01R 29/26* | (2006.01) |
| *G11C 11/16* | (2006.01) |
| *G11C 29/50* | (2006.01) |
| *G01R 31/28* | (2006.01) |

(52) U.S. Cl.
CPC .......... *G01R 29/26* (2013.01); *G01R 31/129* (2013.01); *G01R 31/2879* (2013.01); *G11C 11/1697* (2013.01); *G11C 29/50* (2013.01); *G11C 2029/5002* (2013.01)

(58) Field of Classification Search
None
See application file for complete search history.

(56) References Cited

U.S. PATENT DOCUMENTS

| | | | |
|---|---|---|---|
| 5,337,014 A * | 8/1994 | Najle ................... | G01R 29/26 324/613 |
| 2002/0036919 A1* | 3/2002 | Daughton .............. | B82Y 10/00 365/173 |

OTHER PUBLICATIONS

Amara-Dababi et al., Correlation between write endurance and electrical low frequency noise in MgO based magnetic tunnel junctions, Applied Physics Letters 102, 052404 pp. 1-4, (2013) (Year: 2013).*

Almeida, J. M., et al. "√f noise in linearized low resistance MgO magnetic tunnel junctions." Journal of Applied Physics 99.8 (2006): 08B314. (Year: 2006).*

(Continued)

*Primary Examiner* — Jermele M Hollington
*Assistant Examiner* — Suresh K Rajaputra
(74) *Attorney, Agent, or Firm* — Schwabe, Williamson & Wyatt, P.C.

(57) ABSTRACT

Embodiments include a test circuit to test one or more magnetic tunnel junctions (MTJs) of a magnetic random access memory (MRAM). The test circuit may measure a 1/f noise of the MTJ in the time domain, and determine a power spectral density (PSD) of the 1/f noise. The test circuit may estimate one or more parameters of the MTJ and/or MRAM based on the PSD. For example, the test circuit may determine a noise parameter, such as a Hooge alpha parameter, based on the PSD, and may estimate the one or more parameters of the MTJ and/or MRAM based on the 1/f parameter. Other embodiments may be described and claimed.

23 Claims, 5 Drawing Sheets

(56) References Cited

OTHER PUBLICATIONS

Amara-Dababi, S., et al. "Breakdown mechanisms in MgO based magnetic tunnel junctions and correlation with low frequency noise." 2014 IEEE International Reliability Physics Symposium, Waikoloa, HI (2014): 6A.1.1-6A.1.7. (Year: 2014).*
S. Amara-Dababi., et al. "Correlation between write endurance and electrical low frequency noise in MgO based magnetic tunnel junctions," Applied Physics Letters 102, 052404 (2013), 4 pages.
Almeida, J. M., et al. "1∕ f noise in linearized low resistance MgO magnetic tunnel junctions." Journal of Applied Physics 99.8 (2006): 08B314.†
Amara-Dababi, S., et al. "Breakdown mechanisms in MgO based magnetic tunnel junctions and correlation with low frequency noise." 2014 IEEE International Reliability Physics Symposium, Waikoloa, HI (2014):6A.1.1-6A.1.7.†

\* cited by examiner
† cited by third party

ON-CHIP TEST CIRCUIT FOR MAGNETIC RANDOM ACCESS MEMORY (MRAM)

FIELD

Embodiments of the present invention relate generally to the technical field of electronic circuits, and more particularly to an on-chip test circuit for magnetic random access memory (MRAM).

BACKGROUND

On-chip embedded magnetic random access memory (MRAM) can enable energy and computational efficiency with memory density. The applications for MRAM as an on-chip memory require high reliability.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Figure 1:
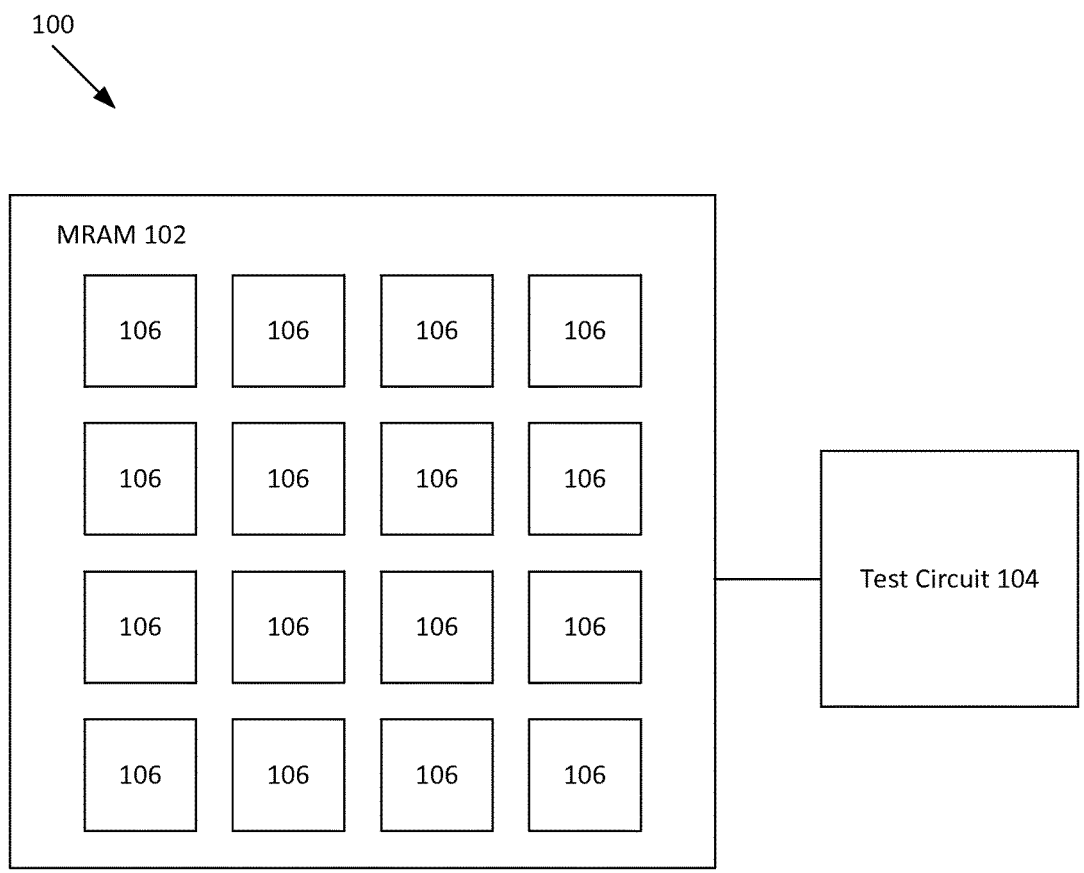
FIG. 1 schematically illustrates a circuit including a magnetic random access memory (MRAM) and a test circuit, in accordance with various embodiments.

FIG. 1 illustrates a circuit 100 including a magnetic random access memory (MRAM) 102 and a test circuit 104. In embodiments, the MRAM 102 and test circuit 104 may be disposed on a same die. The test circuit 104 may provide on-chip testing of the MRAM 102, as further discussed herein.

In various embodiments, the MRAM 102 may include a plurality of MRAM cells 106 (e.g., arranged in an array). The MRAM cells 106 may be spin-transfer torque MRAM (STT-MRAM) cells that each include a magnetic tunnel junction (MTJ).

Figure 2:
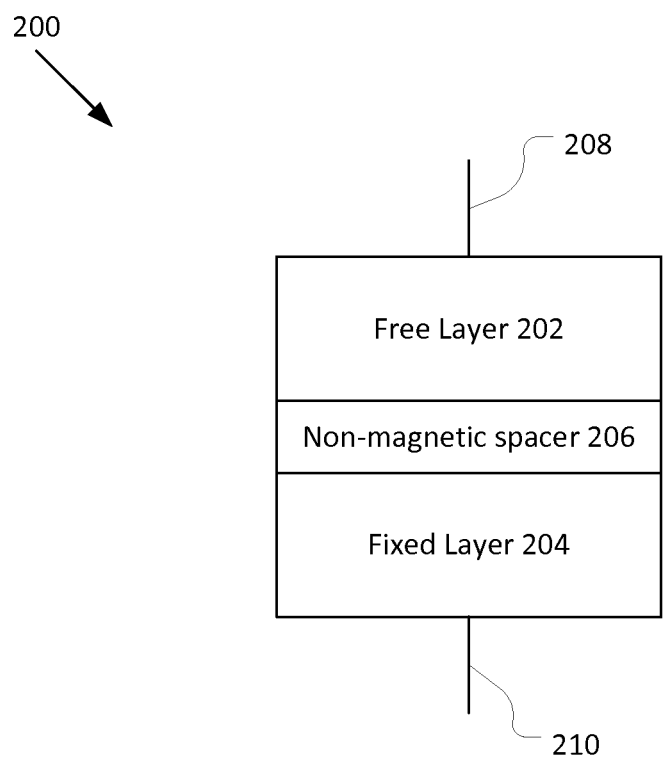
FIG. 2 schematically illustrates a magnetic tunnel junction (MTJ) that may be included in MRAM cells of the MRAM of FIG. 1, in accordance with various embodiments.

For example, FIG. 2 illustrates an MTJ 200 that may be included in the memory cells 106 in various embodiments. The MTJ 200 may include a free layer 202 and a fixed layer 204. The free layer 202 and fixed layer 204 may be magnetic (e.g., ferromagnetic). For example, in some embodiments, the free layer 202 and/or fixed layer 204 may include cobalt iron boron (CoFeB). The MTJ 200 may further include a non-magnetic spacer 206 disposed between the free layer 202 and the fixed layer 204. The non-magnetic spacer 206 may include, for example magnesium oxide (MgO). The MTJ element 200 may further include a terminal 208 coupled to the free layer 202 and a terminal 210 coupled to the fixed layer 204.

In various embodiments, the magnetic orientation of the fixed layer 204 may be fixed, while the magnetic orientation of the free layer 202 may change based on the direction of current flowing through the MTJ 200 (e.g., between the terminal 208 and terminal 210). The MTJ 200 may be switchable between two states according to a magnetic orientation of the free layer 202. For example, in a parallel state, the free layer 202 may be magnetically oriented parallel with the fixed layer 204, while in an anti-parallel state, the free layer 202 may be magnetically oriented anti-parallel with the fixed layer 204. The MTJ 200 may have a first resistance in the parallel state and a second resistance in the anti-parallel state. The second resistance may be higher than the first resistance.

In various embodiments, the MTJ 200 may store a data bit according to the state of the MTJ 200 and the corresponding resistance. For example, the MTJ may be in the parallel state to indicate that the data bit has a first logic value (e.g., logic 0), and the MTJ 200 may be in the anti-parallel state to indicate that the data bit has a second logic value (e.g., logic 1).

Referring again to FIG. 1, in various embodiments, the test circuit 104 may test one or more of the MTJs of the MRAM 102. Some possible sources for MTJ electrical and magnetic failure include: defects in the spacer layer (e.g., MgO) that cause breakdown of the spacer layer (e.g., under high voltage or repeated application of switching pulses), formation and propagation of traps in the spacer layer, formation and propagation of metallic filaments in the spacer layer, migration of elemental ions from the free layer and/or fixed layer into the spacer layer, formation of magnetic sub-domains that cause retention failure in the MTJ, and/or reliability issues due to overdriving of bits near the write driving circuitry. In various embodiments, the test circuit 104 may test the quality of the MTJs based on the noise of the MTJ. For various defect mechanisms, the low frequency noise can be used to test the quality of the MTJ. For example, the test circuit 104 may measure the 1/f noise (e.g., pink noise) of the MTJ in the time domain (e.g., using time-sampled currents at a fixed voltage bias). The test circuit 104 may extract the power spectral density (PSD) and 1/f noise parameter (e.g., hooge-alpha) as a process monitor for patterned MgO quality. The 1/f noise parameter may be correlated with MgO quality and etch quality of the MTJ pillars. The test circuit 104 may determine one or more parameters of the MTJ and/or MRAM 102 based on the 1/f noise parameter. For example, the test circuit 104 may determine the breakdown voltage of the MTJ, a maximum speed of operation to be used for the MRAM, or an estimated lifetime of the MRAM based on the 1/f noise parameter.

In some embodiments, only a subset of the MRAM cells 106 of the MRAM 102 may be tested (e.g., by the test circuit 104 or another test circuit). The condition of the MRAM 102 may be evaluated based on the test results for the one or more MRAM cells 106 that are tested.

Figure 3:
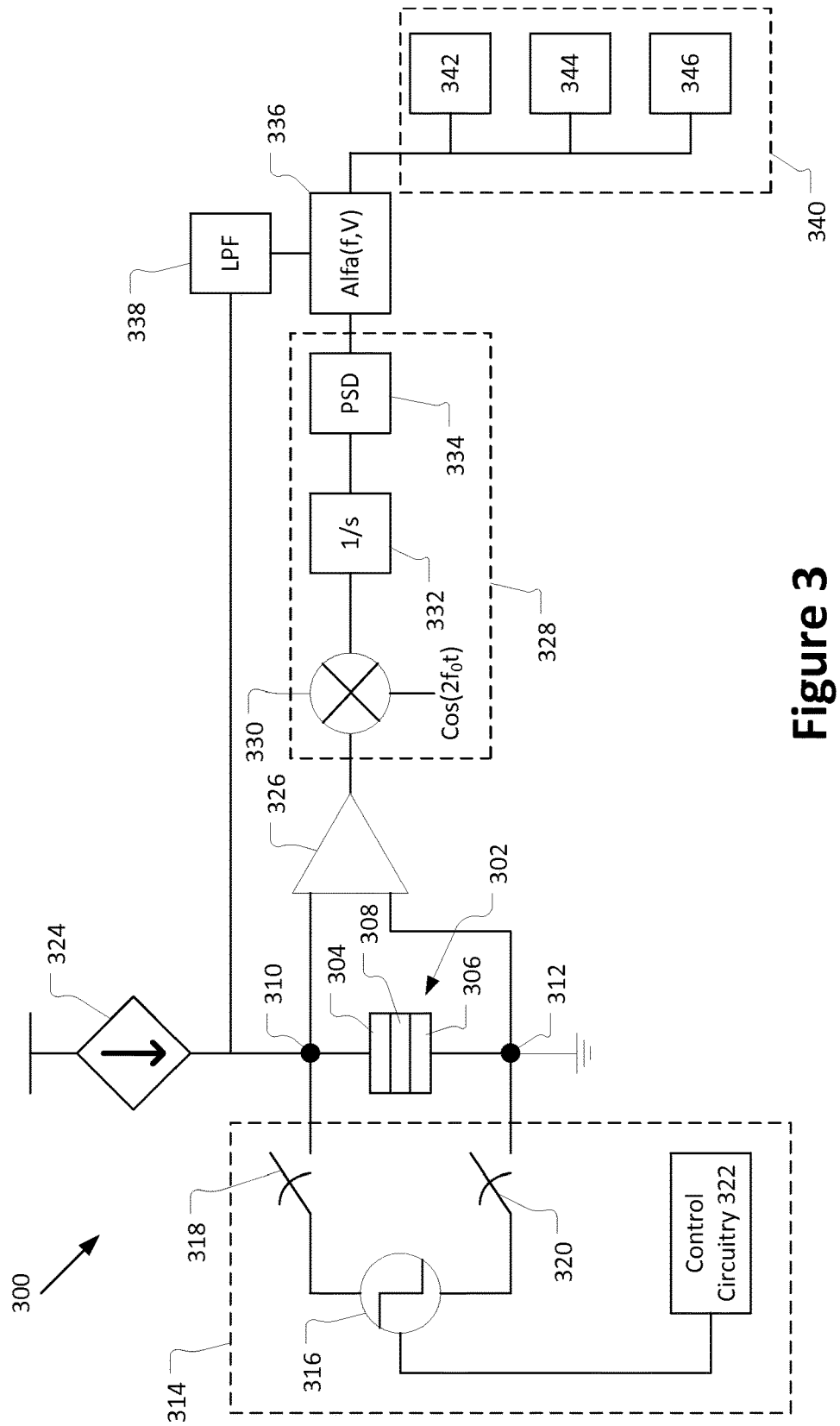
FIG. 3 schematically illustrates a test circuit, in accordance with various embodiments.

FIG. 3 illustrates a test circuit 300 in accordance with various embodiments. The test circuit 300 may correspond to the test circuit 104 in some embodiments. The test circuit 300 may test the quality of an MTJ 302. The MTJ 302 may be included in and/or embody an MRAM cell (e.g., MRAM cell 106). The MTJ 302 may include a free layer 304, a fixed layer 306, and a spacer layer 308. The MTJ 302 may further include a first terminal 310 coupled to the free layer 304, and a second terminal 312 coupled to the fixed layer 306.

The test circuit 300 may include write circuitry 314 to control the state of the MTJ 302 (e.g., to place the MTJ 302 in the parallel state or the anti-parallel state). In some embodiments, the write circuitry 314 may include a voltage source 316 coupled in parallel with the MTJ 302 between the first terminal 310 and the second terminal 312. The voltage source 316 may be coupled to the first terminal 310 by a first switch 318 and may be coupled to the second terminal 312 by a second switch 320.

In some embodiments, the MTJ 302 under test by the test circuit 300 may not be used for storage of data in the MRAM, but may be used as a proxy to test the condition of the other MTJs of the MRAM. In some embodiments, the test circuit 300 may further include control circuitry 322 coupled to the voltage source 316. The control circuitry 322 may estimate an average bandwidth of data that is processed by the MRAM that includes the MTJ 302. The control circuitry 322 may control the voltage source 316 to switch the MTJ 302 with a switching pattern that approximates the estimated average bandwidth. Accordingly, the MTJ 302 may age in a similar manner to other MTJs of the MRAM, and the measurements and determinations made by the test circuit 300 for the MTJ 302 may be representative of other MTJs of the MRAM. The switches 318 and/or 320 may uncouple the voltage source 316 from the MTJ 302 for testing of the MTJ 302 (e.g., for measurement of the 1/f noise).

In various embodiments, the test circuit 300 may further include a current source 324 coupled to the MTJ 302. For example, the current source 324 may be coupled to the first terminal 310, as shown. Alternatively, the current source 324 may be coupled to the second terminal 312. The current source 324 may provide a constant current.

In various embodiments, the test circuit 300 may further include an amplifier 326, with one input of the amplifier 326 coupled to the first terminal 310, and another input of the amplifier 326 coupled to the second terminal 312. The amplifier 326 may generate an output signal, v(t), that corresponds to the voltage across the MTJ 302 (e.g., across the first terminal 310 and second terminal 312). The frequency information in the output signal v(t) may correspond to the 1/f noise of the MTJ 302.

In various embodiments, the test circuit 300 may further include a power spectral density (PSD) estimator 328 to determine a PSD of the 1/f noise based on the output signal, v(t), of the amplifier 326. The PSD estimator 328 may include a multiplier 330, an integrator 332, and PSD logic 334. The multiplier 330 may be coupled to the output of the amplifier 326 to modulate the output signal of the amplifier 326 using a carrier signal (e.g., $\cos(2f_o t)$, where $f_0$ is the frequency of analysis). The integrator 332 may be coupled to the multiplier 330 to integrate the modulated output signal. The integrator 332 may integrate the modulated output signal over an integration time period that corresponds to the frequency of analysis (e.g., $f_0$). The PSD logic 334 may calculate the PSD (e.g., $S_{xx}(f)$) based on the integrated and modulated output signal that is passed from the integrator 332.

In various embodiments, the test circuit 300 may further include custom logic 336 (e.g., Hooge-alpha logic 336) for calculation of a quantitative noise parameter. Logic 336 may be coupled to the PSD logic 334 to receive the PSD. The logic 336 may also receive the voltage at the first terminal 310 (e.g., via a low-pass filter 338). The logic 336 may determine a noise parameter value (e.g., Hooge alpha value) based on the PSD.

In various embodiments, the noise parameter value (e.g., Hooge-alpha value) may be correlated with one or more parameters of the MTJ 302 and/or MRAM. The test circuit 300 may further include estimation circuitry 340 to estimate one or more parameters of the MTJ 302 and/or MRAM based on the noise parameter value. For example, estimation circuitry 340 may include a breakdown voltage estimator 342 to estimate a breakdown voltage of the MTJ 302, a max speed estimator 344 to estimate a maximum speed of operation to be used for the MRAM, and/or a lifetime estimator 346 to estimate a lifetime of the MRAM. In some embodiments, the estimation circuitry 340 may estimate the one or more parameters using a lookup table that correlates the noise parameter value with values of the one or more parameters of the MTJ and/or MRAM.

In some embodiments, the MRAM and/or a processor coupled to the MRAM may adjust the speed of operation of the MRAM (e.g., read and/or write speed) based on the breakdown voltage and/or maximum speed of operation. For example, the speed of operation may be lowered for a lower estimated breakdown voltage. The voltage across the spacer layer of the MTJ may be inversely proportional to the switching time (e.g., time between switching edges). The speed of operation may be set so that the voltage across the spacer layer of the MTJ is less than the breakdown voltage (e.g., by a safety margin).

In various embodiments, the 1/f noise of the MTJ 302 may be caused by defects (e.g., traps) in the spacer layer 308 (e.g., oxide layer, such as MgO) that cause trapping and de-trapping of electrons. For example, for a single trap state with life time $1/\lambda$ the Fourier transform of the current noise may be given by Equation (1):

$$F(f) = \int_{-\infty}^{\infty} \sum_{k} N(t - t_k) e^{-ift} dt \qquad (1)$$

where N(t) is the current through the trap, f is frequency, t is time, and $t_k$ is a time constant for trap k. The current from discrete trapping events may be given by Equation (2):

$$N(t) = N_0 e^{-\lambda t} \qquad (2)$$

where $N_0$ is the maximum current from a single trapping event.

The PSD of the current due to a single defect may be given by Equation (3):

$$S(f) = \lim_{t \to \infty} \frac{1}{T} \langle \|F(f)\|^2 \rangle = \frac{N_0^2 n}{\lambda^2 + f^2} \qquad (3)$$

where n is the total number of traps.

The effect of many simultaneous defects spread over characteristic times of $\lambda_1$ to $\lambda_2$ leads to the 1/f noise in the frequency range $1/\lambda_2$ to $1/\lambda_1$. For example, Equation (4) illustrates the PSD, S(f), of the 1/f noise caused by a plurality of defects:

$$S(f) = \frac{N_0^2 n \pi}{2 f (\lambda_2 - \lambda_1)} \qquad (4)$$

In various embodiments, the PSD of the 1/f noise at a fixed frequency (e.g., below the knee frequency of 1/f noise with thermal noise) may follow the Hooge equation as shown in Equation (5):

$$\frac{S_I}{I^2} = \frac{S_V}{V^2} = \frac{\alpha}{A_{MTJ}} \times \frac{1}{f} \qquad (5)$$

where $S_I$ is the PSD in the current domain, I is the current at the terminal 310 of the MTJ 302, $S_V$ is the PSD in the voltage domain, V is the voltage at the terminal 310 of the MTJ 302, $\alpha$ is the Hooge-alpha parameter, $A_{MTJ}$ corresponds to an area of the MTJ 302, and f is the frequency of analysis. Accordingly, the Hooge-alpha logic 336 may determine the Hooge-alpha parameter according to Equation (6):

$$\alpha = \frac{S_V}{V^2} \frac{f_0}{A_{MTJ}} \qquad (6)$$

Although the test circuit 300 is shown to use the voltage-domain PSD to determine the Hooge alpha parameter, other embodiments may use the current-domain PSD to determine the Hooge alpha parameter.

In some embodiments, the test circuit 300 may perform the test process described herein while the MTJ 302 is under an applied magnetic field. The Hooge alpha value determined under the applied magnetic field may be correlated with one or more magnetic domain parameters of the MTJ 302 and/or MRAM, such as the magnetic domain lifetime. Accordingly, the estimation circuitry 340 of the test circuit 300 may determine one or more magnetic domain parameters of the MTJ 302 and/or MRAM based on the Hooge alpha value determined under the applied magnetic field.

The test circuits 100 and/or 300 described herein may provide on-chip monitoring of the MRAM that is non-destructive and faster than prior monitoring techniques, such as a analysis of the MTJ using a tunneling electron microscope (TEM). Furthermore, the test circuit 100 and/or 300 allows estimation of the break down voltage, maximum operating speed, and/or lifetime of the MTJ and/or MRAM. Additionally, the test circuit 100 and/or 300 does not require an off-chip spectrum analyzer to measure the noise of the MTJ in the frequency domain.

Figure 4:
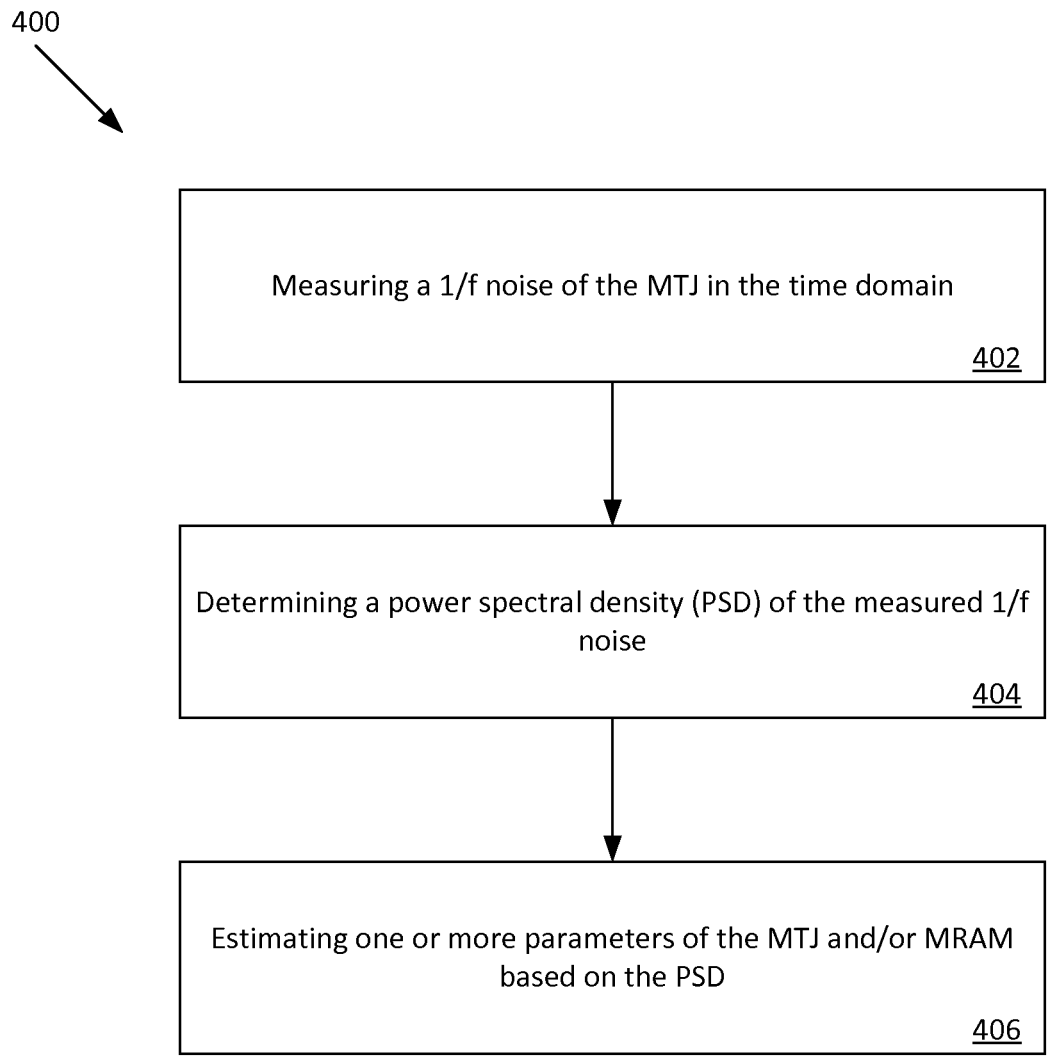
FIG. 4 is a flow chart illustrating a method for testing an MTJ in accordance with various embodiments.

FIG. 4 is a flow chart that illustrates a method 400 for testing an MTJ (e.g., the MTJ 200 and/or 302), in accordance with various embodiments. The MTJ may be included in an MRAM (e.g., the MRAM 102) in some embodiments. The method 400 may be performed by a test circuit, such as the test circuit 100 and/or 300. The test circuit may be disposed on the same die (e.g., chip) as the MTJ and MRAM. In some embodiments, the test circuit may include means to perform the various operations of the method 400. In some embodiments, the test circuit may include one or more non-transitory computer-readable media having instructions, stored thereon, that when executed cause the test circuit to perform the method 400.

At 402, the method 400 may include measuring a 1/f noise of the MTJ in the time domain. At 404, the method 400 may include determining the PSD of the measured 1/f noise.

At 406, the method 400 may include estimating one or more parameters of the MTJ and/or MRAM based on the PSD. For example, in some embodiments, the method 400 may include determining a noise parameter value (e.g., Hooge alpha value) based on the PSD, and the one or more parameters may be estimated based on the noise parameter value. In some embodiments, the one or more parameters may be estimated using a lookup table. The one or more parameters may include, for example, a breakdown voltage, a maximum operating speed, and/or a lifetime of the MTJ and/or MRAM.

Figure 5:
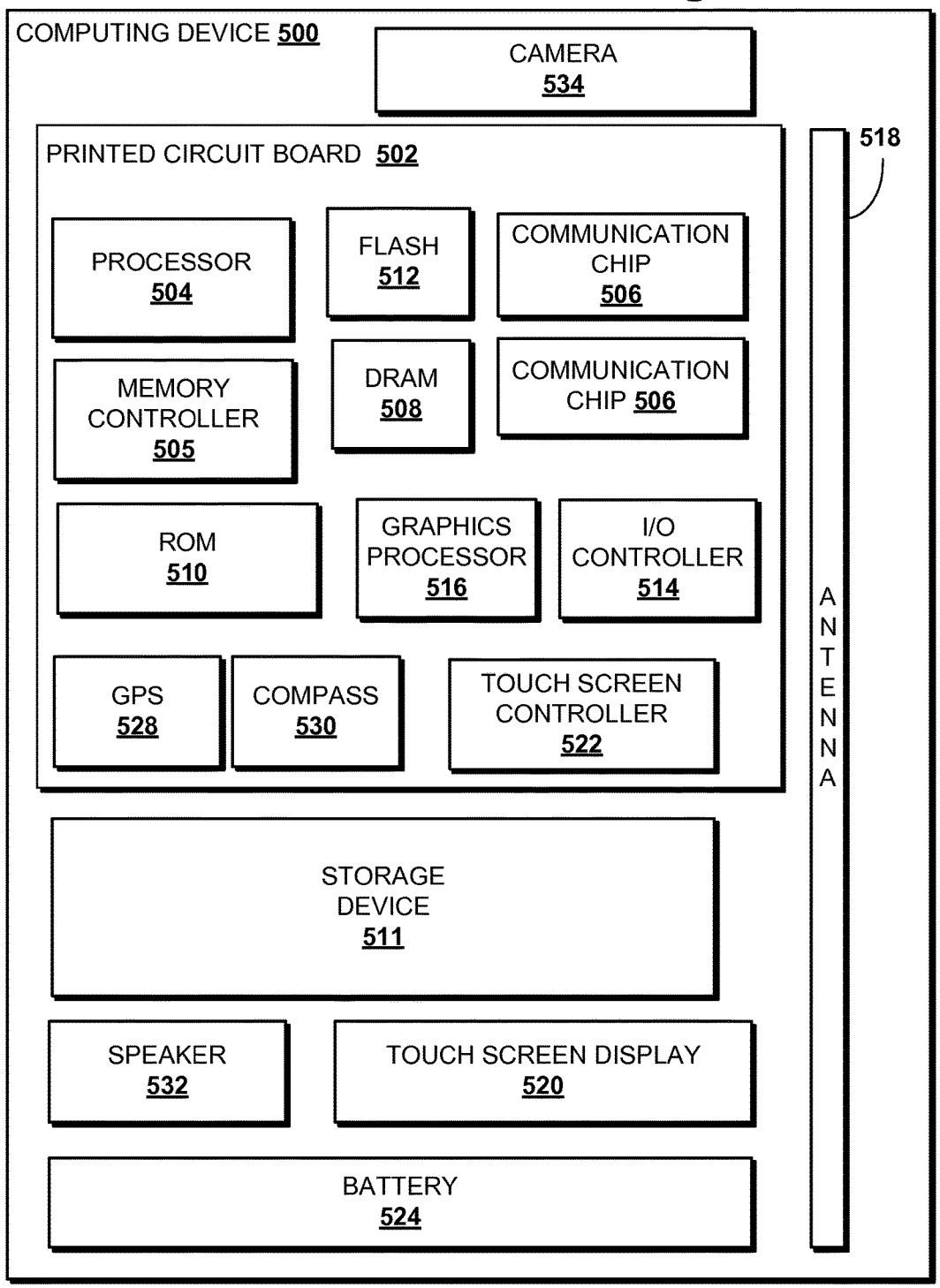
FIG. 5 illustrates an example system configured to employ the apparatuses and methods described herein, in accordance with various embodiments.

FIG. 5 illustrates an example computing device 500 that may employ the apparatuses and/or methods described herein (e.g., circuit 100, MTJ 200, test circuit 300, method 400), in accordance with various embodiments. As shown, computing device 500 may include a number of components, such as one or more processor(s) 504 (one shown) and at least one communication chip 506. In various embodiments, the one or more processor(s) 504 each may include one or more processor cores. In various embodiments, the at least one communication chip 506 may be physically and electrically coupled to the one or more processor(s) 504. In further implementations, the communication chip 506 may be part of the one or more processor(s) 504. In various embodiments, computing device 500 may include printed circuit board (PCB) 502. For these embodiments, the one or more processor(s) 504 and communication chip 506 may be disposed thereon. In alternate embodiments, the various components may be coupled without the employment of PCB 502.

Depending on its applications, computing device 500 may include other components that may or may not be physically and electrically coupled to the PCB 502. These other components include, but are not limited to, memory controller 505, volatile memory (e.g., dynamic random access memory (DRAM) 508), non-volatile memory such as read only memory (ROM) 510, flash memory 512, storage device 511 (e.g., a hard-disk drive (HDD)), an I/O controller 514, a digital signal processor (not shown), a crypto processor (not shown), a graphics processor 516, one or more antenna 518, a display (not shown), a touch screen display 520, a touch screen controller 522, a battery 524, an audio codec (not shown), a video codec (not shown), a global positioning system (GPS) device 528, a compass 530, an accelerometer (not shown), a gyroscope (not shown), a speaker 532, a camera 534, and a mass storage device (such as hard disk drive, a solid state drive, compact disk (CD), digital versatile disk (DVD)) (not shown), and so forth.

In various embodiments, the MRAM and/or test circuit described herein (e.g., circuit 100, MTJ 200, test circuit 300) may be included in any suitable component or components of the system 500, such as the volatile memory 508, storage device 511, processor 504, and/or communication chip 506. In various embodiments, the processor 504 may be integrated on the same die with other components to form a System on Chip (SoC). For example, the processor 504 may be integrated on the same die with the MRAM and test circuit described herein.

In some embodiments, the one or more processor(s) 504, flash memory 512, and/or storage device 511 may include associated firmware (not shown) storing programming instructions configured to enable computing device 500, in response to execution of the programming instructions by one or more processor(s) 504, to practice all or selected aspects of the methods described herein. In various embodiments, these aspects may additionally or alternatively be implemented using hardware separate from the one or more processor(s) 504, flash memory 512, or storage device 511.

The communication chips 506 may enable wired and/or wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth, and a second communication chip 506 may be dedicated to longer range wireless communications such as GPS, EDGE, GPRS, CDMA, WiMAX, LTE, Ev-DO, and others.

In various implementations, the computing device 500 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 500 may be any other electronic device that processes data.

Some non-limiting Examples are presented below.

Example 1 is a circuit for testing a memory, the circuit comprising: a magnetic random access memory (MRAM) including an MRAM cell that includes a magnetic tunnel junction (MTJ); and a test circuit, coupled to the MRAM. The test circuit is to: measure a noise of the MTJ in a time domain; and estimate a breakdown voltage of the MTJ based on the measured noise.

Example 2 is the circuit of Example 1, wherein the test circuit and the MRAM are disposed on a same die.

Example 3 is the circuit of Example 1, wherein the test circuit includes: a power spectral density (PSD) estimator to determine a PSD of the noise; and logic to determine a noise parameter value based on the PSD; wherein the test circuit is to estimate the breakdown voltage of the MTJ based on the determined noise parameter value.

Example 4 is the circuit of Example 3, wherein the test circuit is to estimate the breakdown voltage of the MTJ based on the determined noise parameter value using a lookup table.

Example 5 is the circuit of Example 3, wherein the test circuit is further to estimate a max speed to be used for the MRAM or a lifetime of the MRAM based on the noise parameter value.

Example 6 is the circuit of Example 3, wherein the test circuit further comprises an amplifier with input terminals coupled to respective first and second terminals of the MTJ, and wherein the PSD estimator further includes: a multiplier to modulate an output signal of the amplifier, and an integrator to integrate the modulated output signal.

Example 7 is the circuit of Example 1, further comprising a current source coupled to the MTJ to provide a constant current.

Example 8 is the circuit of Example 7, further comprising a voltage source coupled in parallel with the MTJ to provide a voltage signal to control a state of the MTJ.

Example 9 is the circuit of Example 8, further comprising a control circuit coupled to the voltage source, the control circuit to: estimate an average bandwidth of the MRAM; and control the voltage signal provided by the voltage source based on the estimated average bandwidth.

Example 10 is the circuit of Example 8, wherein the voltage source is coupled with the MTJ by one or more switches, wherein the one or more switches are to uncouple the voltage source from the MTJ when the test circuit measures the noise.

Example 11 is the circuit of any one of Examples 1 to 10, wherein the noise is 1/f noise.

Example 12 is a circuit for testing a memory, the circuit comprising: a test circuit disposed on a same die as a magnetic random access memory (MRAM), the test circuit including: noise measurement circuitry to measure a 1/f noise of a magnetic tunnel junction (MTJ) of the MRAM; a power spectral density (PSD) estimator to determine a PSD of the 1/f noise; and estimation circuitry to estimate one or more parameters of the MRAM based on the PSD.

Example 13 is the circuit of Example 12, wherein the one or more parameters include a breakdown voltage, a max speed to be used for the MRAM or a lifetime of the MRAM.

Example 14 is the circuit of Example 12, wherein the test circuit further comprises logic to determine a noise parameter value based on the PSD, wherein the estimation circuitry is to estimate the one or more parameters of the MRAM based on the determined noise parameter value.

Example 15 is the circuit of any one of Examples 12 to 14, wherein the noise measurement circuitry is to measure the 1/f noise in a time domain.

Example 16 is the circuit of Example 12, wherein the noise measurement circuitry includes an amplifier with input terminals coupled to respective first and second terminals of the MTJ, and wherein the PSD estimator includes: a multiplier to modulate an output signal of the amplifier, and an integrator to integrate the modulated output signal.

Example 17 is an apparatus for testing a magnetic tunnel junction (MTJ) comprising: means to measure a 1/f noise of the MTJ in a time domain; means to estimate a power spectral density (PSD) of the MTJ based on the 1/f noise; and means to estimate a breakdown voltage of the MTJ based on the PSD.

Example 18 is the apparatus of Example 17, further comprising means to determine a noise parameter value based on the PSD, wherein the means to estimate the breakdown voltage is to estimate the breakdown voltage based on the noise parameter value.

Example 19 is the apparatus of Example 17 or Example 18, further comprising a magnetic random access memory (MRAM) including the MTJ.

Example 20 is the apparatus of Example 19, further comprising: means to estimate an average bandwidth of the MRAM; and means to generate a signal across the MTJ based on the estimated average bandwidth.

Example 21 is a computing system comprising: a network interface to communicate over a wireless communication network; a processor coupled to the network interface; a magnetic random access memory (MRAM) coupled to the processor, the MRAM having a plurality of magnetic tunnel junctions (MTJs) including a first MTJ; and a test circuit, coupled to the first MTJ. The test circuit includes: a power spectral density (PSD) estimator to determine a PSD of 1/f noise of the MTJ; Hooge-alpha logic to determine a Hooge alpha value based on the PSD; and estimation circuitry to estimate a breakdown voltage of the MTJ based on the Hooge alpha value.

Example 22 is the system of Example 21, wherein the test circuit further includes noise measurement circuitry to measure the 1/f noise of the MTJ in a time domain.

Example 23 is the system of Example 22, wherein the noise measurement circuitry includes an amplifier with input terminals coupled to respective first and second terminals of the MTJ, and wherein the PSD estimator includes: a multiplier to modulate an output signal of the amplifier; an integrator to integrate the modulated output signal; and PSD logic to calculate the PSD based on the integrated modulated output signal.

Example 24 is the system of Example 21, wherein the processor, MRAM, and test circuit are disposed on a same die.

Example 25 is the system of any one of Examples 21 to 24, further comprising: one or more antennas coupled to the network interface; and a display coupled to the processor.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A circuit comprising:
    a magnetic random access memory (MRAM) including an MRAM cell that includes a magnetic tunnel junction (MTJ);
    a voltage source coupled in parallel with the MTJ to provide a voltage signal to control a state of the MTJ;
    a control circuit coupled to the voltage source, the control circuit to:
        estimate an average bandwidth of the MRAM; and
        control the voltage signal provided by the voltage source based on the estimated average bandwidth; and
    a test circuit, coupled to the MRAM, to:
        measure a noise of the MTJ in a time domain; and
        estimate a breakdown voltage of the MTJ based on the measured noise.

2. The circuit of claim 1, wherein the test circuit and the MRAM are disposed on a same die.

3. The circuit of claim 1, wherein the test circuit includes:
    a power spectral density (PSD) estimator to determine a PSD of the noise; and
    logic to determine a noise parameter value based on the PSD;
    wherein the test circuit is to estimate the breakdown voltage of the MTJ based on the determined noise parameter value.

4. The circuit of claim 3, wherein the test circuit is to estimate the breakdown voltage of the MTJ based on the determined noise parameter value using a lookup table.

5. The circuit of claim 3, wherein the test circuit is further to estimate a max speed to be used for the MRAM or a lifetime of the MRAM based on the noise parameter value.

6. The circuit of claim 3, wherein the test circuit further comprises an amplifier with input terminals coupled to respective first and second terminals of the MTJ, and wherein the PSD estimator further includes:
    a multiplier to modulate an output signal of the amplifier; and
    an integrator to integrate the modulated output signal.

7. The circuit of claim 1, further comprising a current source coupled to the MTJ to provide a constant current.

8. The circuit of claim 1, wherein the voltage source is coupled with the MTJ by one or more switches, wherein the one or more switches are to uncouple the voltage source from the MTJ when the test circuit measures the noise.

9. The circuit of claim 1, wherein the noise is 1/f noise.

10. A circuit comprising:
    a test circuit disposed on a same die as a magnetic random access memory (MRAM), the test circuit including:

a control circuit to estimate an average bandwidth of the MRAM and to control switching of a magnetic tunnel junction (MTJ) based on the estimated average bandwidth;

noise measurement circuitry to measure a 1/f noise of the MTJ;

a power spectral density (PSD) estimator to determine a PSD of the 1/f noise; and estimation circuitry to estimate one or more parameters of the MRAM based on the PSD.

11. The circuit of claim 10, wherein the one or more parameters include a breakdown voltage, a max speed to be used for the MRAM or a lifetime of the MRAM.

12. The circuit of claim 10, wherein the test circuit further comprises logic to determine a noise parameter value based on the PSD, wherein the estimation circuitry is to estimate the one or more parameters of the MRAM based on the determined noise parameter value.

13. The circuit of claim 10, wherein the noise measurement circuitry is to measure the 1/f noise in a time domain.

14. The circuit of claim 10, wherein the noise measurement circuitry includes an amplifier with input terminals coupled to respective first and second terminals of the MTJ, and wherein the PSD estimator includes:

a multiplier to modulate an output signal of the amplifier; and an integrator to integrate the modulated output signal.

15. An apparatus comprising:

means to measure a 1/f noise of a magnetic tunnel junction (MTJ) in a time domain;

means to estimate a power spectral density (PSD) of the MTJ based on the 1/f noise; and means to estimate a breakdown voltage of the MTJ based on the PSD.

16. The apparatus of claim 15, further comprising means to determine a noise parameter value based on the PSD, wherein the means to estimate the breakdown voltage is to estimate the breakdown voltage based on the noise parameter value.

17. The apparatus of claim 15, further comprising a magnetic random access memory (MRAM) including the MTJ.

18. The apparatus of claim 17, further comprising:

means to estimate an average bandwidth of the MRAM; and means to generate a signal across the MTJ based on the estimated average bandwidth.

19. A computing system comprising:

a network interface to communicate over a wireless communication network;

a processor coupled to the network interface;

a magnetic random access memory (MRAM) coupled to the processor, the MRAM having a plurality of magnetic tunnel junctions (MTJs) including a first MTJ; and a test circuit, coupled to the first MTJ, the test circuit including:

a control circuit to estimate an average bandwidth of the MRAM and to control switching of a magnetic tunnel junction (MTJ) based on the estimated average bandwidth;

a power spectral density (PSD) estimator to determine a PSD of 1/f noise of the first MTJ; and Hooge-alpha logic to determine a Hooge alpha value based on the PSD; and estimation circuitry to estimate a breakdown voltage of the first MTJ based on the Hooge alpha value.

20. The system of claim 19, wherein the test circuit further includes noise measurement circuitry to measure the 1/f noise of the MTJ in a time domain.

21. The system of claim 20, wherein the noise measurement circuitry includes an amplifier with input terminals coupled to respective first and second terminals of the MTJ, and wherein the PSD estimator includes:

a multiplier to modulate an output signal of the amplifier;

an integrator to integrate the modulated output signal; and

PSD logic to calculate the PSD based on the integrated modulated output signal.

22. The system of claim 19, wherein the processor, MRAM, and test circuit are disposed on a same die.

23. The system of claim 19, further comprising:

one or more antennas coupled to the network interface; and a display coupled to the processor.

* * * * *